(12) United States Patent
Hong et al.

(10) Patent No.: US 6,201,824 B1
(45) Date of Patent: Mar. 13, 2001

(54) STRONGLY COMPLEX COUPLED DFB LASER SERIES

(75) Inventors: Jin Hong, Nepean (CA); Toshihiko Makino, San Jose, CA (US)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/209,860

(22) Filed: Dec. 11, 1998

Related U.S. Application Data (63) Continuation-in-part of application No. 08/998,071, filed on Dec. 24, 1997, now Pat. No. 6,104,739.

(51) Int. Cl.[7] .................................................. H01S 5/125
(52) U.S. Cl. ............................. 372/50; 372/23; 372/96; 372/102
(58) Field of Search ........................... 372/50, 23, 96, 372/102

(56) References Cited

U.S. PATENT DOCUMENTS

| | | | |
|---|---|---|---|
| 4,885,753 | * 12/1989 | Okai et al. | 372/45 |
| 4,980,895 | * 12/1990 | Nishimura | 372/96 |
| 5,077,752 | * 12/1991 | Tada et al. | 372/96 |
| 5,936,994 | * 8/1999 | Hong et al. | 372/96 |

OTHER PUBLICATIONS

"Couple–Wave Theory of Distributed Feedback Lasers", *J.Appl.Phys.*, H. Kogelnik et al., May 1972, vol. 43, No. 5, pp. 2327–2335.

"D/4–Shifted InGaAsP/InP DFB Lasers", *IEEE Journal of Quantum Electronics*, Katsuyuki Utaka et al., Jul. 1986, vol. QE–22, No. 7, pp. 1042–1051.

"DFB Sources—A Robust WDM Network Laser Source: The DFB–Cascade Laser", *OFC'97 Technical Digest*, John E. Bowers, pp. 235–236, (No Month).

\* cited by examiner

*Primary Examiner*—James W. Davie
(74) *Attorney, Agent, or Firm*—Foley & Lardner; Victoria Donnelly (57) ABSTRACT

A two-dimensional matrix of complex coupled (gain or loss coupled) semiconductor DFB lasers is disclosed. The matrix includes several parallel branches of series lasers, each series having a plurality of lasers which are grown on the same wafer. The parallel branches are combined at either one end or both ends with either an integrated on-chip optical combiner or an external coupler to obtain a single optical output port. Each laser in the series comprises a multiple quantum well active region and a complex coupled grating having corrugations along a cavity length direction formed by periodic etching grooves through either the active region or the lossy QW region. The depth of etching is defined so as to provide a substantial insensitivity of each laser to the external feedback and random facet variations and to thereby ensure no substantial interaction between lasers in the series. Bragg wavelengths of lasers from different series interleave with each other or differ incrementally along a cavity length direction. The sub tuning wavelength range covered by one laser in the matrix falls outside of the stopbands of all other lasers which are not only in the same series but also physically close to the designated output port. The laser structure is capable of simultaneous multi-wavelength generation, and/or tunable selectable single wavelength operation, and/or reliable wavelength switching.

45 Claims, 8 Drawing Sheets

STRONGLY COMPLEX COUPLED DFB LASER SERIES

RELATED APPLICATIONS

This application is a Continuation-in-Part of U.S. patent application Ser. No. 08/998,071 to J. Hong filed Dec. 24, 1997, U.S. Pat. No. 6,104,739 and incorporated herein by reference.

FIELD OF INVENTION

The invention relates to semiconductor lasers, and in particular, to complex coupled distributed feedback (DFB) semiconductor lasers arranged in parallel series and capable of multi-wavelength generation and extended wavelength tuning range.

BACKGROUND OF THE INVENTION

Fiber optics communication systems require compact light emitting sources capable of generating single-mode, tunable, narrow linewidth radiation in the 1.3–1.56 $\mu$m wavelength range. Some of the existing semiconductor lasers, for example, InGaAsP DFB lasers can meet requirements for high power and proper wavelength, but fail to satisfy requirements for high side mode suppression ration (SMSR), predictability and controllability of generated wavelength, insensitivity to external feedback and random facet phase variations, simple manufacturing and high device yield. Additionally, a rapid advance in high speed and large capacity dense wavelength division multiplexing (DWDM) fiber optics systems continuous to demand semiconductor lasers not only possessing properties mentioned above but also capable of providing a wide continuous tuning range and multi-wavelength generation for practical and cost effective applications.

Conventional index coupled DFB lasers employing an index corrugation have an inherent problem in existence of two longitudinal modes with an equal threshold gain which results in poor single mode operation as shown, for example, in the article by H. Kogelnik and C. V. Shank "Coupled-mode theory of distributed feedback lasers", J. Appl. Phys., vol. 43, no. 5, pp. 2327–2335, 1972.

For index coupled DFB lasers, the longer and shorter wavelength Bragg modes around the laser stop band are intrinsically degenerate in terms of the threshold gain. The degeneracy may be broken, for example, in the presence of asymmetric facet coatings and facet phase variations. The yield of DFB lasers with a fixed lasing wavelength and a predetermined SMSR is very low in practice because of the random variations of facet phase, yield usually being not more than several percent. Without internal built-in mode discrimination between the two degenerate modes, mode properties of index coupled DFB lasers are primarily determined by asymmetric facet coatings and variations of facet phases. As a result these lasers are very sensitive to variations of the effective laser facet phases and can be strongly influenced by any external feedback.

For quarter wavelength shifted DFB lasers, described, for example, in the article by K. Utaka, S. Akiba, K. Sakai, and Y. Matsushima "$\lambda$/4-shifted InGaAsP/InP DFB lasers", IEEE J. of Quantum Electronics, Vol. QE-22, no.7, p.1042–1052 (1986), an additional phase shift is introduced into the laser structure to break the degeneracy between the two Bragg modes around the stop band. The yield of this type of lasers ensuring single-mode operation is higher than the conventional index coupled DFB lasers. However, since the laser operation is based upon an additional phase introduced into the structure, it is critically dependent on the phase shift which has been actually introduced to the laser and which is very difficult to control or manufacture in large scale. The laser facet phase still plays a significant role since it works together with the introduced built-in phase to satisfy the round-trip phase condition for resonance. A good anti-reflection (AR/AR) coating reduces the effect of the facet phase on the laser properties. However, the quarter wavelength shift laser usually suffers from a large longitudinal spatial-hole burning (SHB), resulting from the phase shift introduced in the center of the laser, especially when a large index coupling is required to reduce a threshold current in the case of AR/AR coating. Strong SHB may quickly degrade the SMSR when the injection current is increased.

When a laser is facet phase sensitive or critically dependent on the phase shift introduced within the cavity, it becomes very sensitive to any perturbations or variations in its operational conditions. When a number of such lasers are arranged in a series, they interact with each other. The presence of one laser influences on operation of other lasers. One laser usually acts as an effective grating-based reflector to cause reflections fed back into other lasers to vary not only in amplitude, but also in phase, both being wavelength dependent. Additionally, both the amplitude and the phase are also dependent on the operational conditions of adjacent lasers, such as temperature, injection current and leakage current between the lasers. Thus, interaction between lasers significantly influences the lasing behavior of each laser, resulting in an extremely low device yield and poor laser performance. Often stable operation of the series as a whole is impossible.

O. Sahlen, L. Lundqvist, J. Terlecki and J. P. Weber in the article "A robust WDM network laser source: the DFB-Cascaded laser", ThB1, OFC'97, Dallas, USA, described an attempt to use quarter wavelength shifted DFB lasers as building blocks in a series. Although quarter wavelength shifted DFB lasers exhibit a high single mode yield in theory, they suffer from a large spatial hole burning as discussed above. Their current tuning range is also relatively small due to the potential onset of other longitudinal modes caused by spatial hole burning. As a result, the series as a whole did not demonstrate high performance and stability, and simultaneous multi-wavelength operation was not reported at all.

The predictability of the lasing wavelength for each individual DFB laser is also a critical parameter for the series operation. Even if one of the lasers, working as a perfect single-mode laser, happens to lase on a wrong side of the stop band, the entire series will fail in its operation. The same result will happen if one laser unexpectedly switches between the two Bragg modes, which is unacceptable for practical system applications.

Therefore, in order to obtain a good performance of series DFB lasers, it is critical to ensure that each laser operates substantially independently and has no influence on the lasing behavior of other lasers in the series, thus, providing no substantial interaction between lasers in the series, each laser maintaining high performance characteristics at the same time.

A series of lasers described in the above referenced U.S. Pat. No. 6,104,739 to J. Hong provides emitting of single or multi-wavelength generation from one single common output due to independent generation of the lasers forming the series, and ensures an enhanced tuning range of the series of lasers relative to a single laser approach. However, light generated by the lasers which are remote from the output facet of the series experiences losses when travelling through the remaining lasers which are closer to the output facet. Therefore in practice a maximum number of lasers used in the series is limited. Furthermore, in order to obtain a continuous wavelength tuning, the stopband of the laser and the wavelength spacing between the lasers have to be carefully arranged in order to both cover the entire tuning range and also minimize the potential interaction among lasers.

There is still a need in the industry to increase the number of wavelengths which can be simultaneously generated by laser structures (and correspondingly to increase the number of data channels to be transmitted), and further to enhance the tuning range of the output radiation. It is also critical to provide compact arrangement of lasers, reduce the size and the number of optical components used, reduce losses and provide compact packaging of the system.

SUMMARY OF THE INVENTION

It is an object of the present invention to provide a structure of DFB semiconductor lasers which avoids the afore-mentioned problems.

Thus, according to one aspect of the present invention there is provided a laser structure comprising a plurality of semiconductor laser series arranged in a cascade to form a matrix of lasers, each series having an output facet and including a plurality of complex coupled distributed feedback semiconductor lasers having laser cavities arranged coaxially along the same optical axis, each laser comprising:

a) a substrate;
b) an active region formed on the substrate and comprising a multiple quantum well structure;
c) an excitation means for pumping the active region;
d) a complex coupled grating having corrugations along the optical axis formed by periodic etching grooves through the active region, the grating having a period comprising a first section and a second section, wherein substantially all quantum wells are etched away from the second section providing no substantial photon emission in the second section and ensuring no substantial interaction between lasers in the series,
a Bragg wavelength of each laser in the series being outside the stop bands of all other lasers which are closer to the output facet of the series.

The laser structure further includes an optical combiner to direct light generated by the plurality of series into a common output. Conveniently, the structure may have two optical combiners which provide two outputs of the generated light in opposite directions. Light from one of the outputs may be used, for example, for wavelength monitoring and stabilization. The combiners may be either passive or active, i.e. providing additional amplification of light, each of them being either of an external or internal type. Preferably, the internal optical combiner is an on-chip single mode waveguide combiner or a multi-mode interference combiner. Each series includes a pre-determined number of lasers which may be conveniently the same for each series. Preferably, each series of lasers has only one output facet and comprises two or more lasers. Conveniently, all series of lasers provide output of generated light in the same direction. Alternatively, the laser structure may have a pre-determined number of series which provide a first output for generated light in one direction, the rest of the series providing a second output for the generated light in the opposite direction. Then the laser structure would require two optical combiners at first and second outputs correspondingly as described above. In yet another alternative the laser structure may provide output of generated light in two opposite directions where each of laser series operates in one of the single wavelength and multi-wavelength regime. The laser structure may further comprise means for tuning a laser wavelength of each laser around a corresponding lasing mode. The laser structure includes a plurality of laser series which are either series of gain coupled lasers comprising gain coupled gratings or loss coupled lasers comprising loss coupled gratings. The series of gain coupled lasers are preferably arranged so that each laser in a particular series generates at the right Bragg mode around its stop band, and the Bragg modes of lasers differ so as to provide a continuous tuning range for the series as a whole.

For the series of loss coupled lasers it is preferred for each laser to generate at the left Bragg mode around its stop band, and the Bragg modes of lasers to differ so as to provide a continuous tuning range for the series as a whole. Preferably, tuning ranges of different series are chosen so as to provide a continuous wavelength range for the matrix as a whole. Alternatively, Bragg wavelength of lasers from different series may interleave with each other. A multiplicity of interleaving may range up to the number of series in the matrix. Conveniently, the matrix may include an even number of series combined into pairs, wherein Bragg wavelengths of lasers within each pair are interleaved. Other arrangements of laser wavelengths providing no substantial interaction between lasers within the series are also possible.

The matrix may further comprise means for wavelength switching between the lasing modes generated by lasers in the series. The laser structure is also capable of multi-wavelength generation, with a number of generated wavelengths being equal to a number of lasers in the matrix excited above threshold levels. Conveniently, the laser structure is integrated within a package which also includes an on-chip optical combiner.

The complex coupled grating, providing insensitivity of the laser to the external feedback and random facet phase variations, comprises a first section and a second section, wherein substantially all quantum wells are etched away from the second section. Thus, no substantial photon emission is generated in the second section. Height and shape of the sections define intensity of the photon emission in the sections. Conveniently, the first and second sections may have a rectangular or trapezoidal shape, or the second section may be V-shaped. Preferably, the grating is a first order uniform grating. Alternatively, it may be a chirped grating, depending on application requirements. The excitation means for pumping the active region comprises electrical contacts for current injection into the active region. Alternatively, the lasers in the series may be capable of coupling to external optical pumping sources to create population inversion. When the laser is electrically pumped, a current confining region is formed on the active region, the region being a ridge waveguide or a buried hetero-structure.

According to another aspect of the invention there is provided a laser structure comprising a plurality of semiconductor laser series arranged in a cascade to form a matrix of lasers, each series including a plurality of complex coupled distributed feedback semiconductor lasers having laser cavities arranged coaxially along the same optical axis, each laser comprising:

a) a substrate;
b) an active region formed on the substrate and comprising a multiple quantum well structure;
c) an excitation means for pumping the active region;

d) a complex coupled grating having corrugations along the optical axis formed by periodic etching grooves through the active region, the grating having a period comprising a first section and a second section, wherein substantially all quantum wells are etched away from the second section providing no substantial photon emission in the second section and ensuring no substantial interaction between lasers in the series;

a Bragg wavelength of each laser in the matrix being outside the stopbands of all other lasers which are physically closer to an output port of,the matrix.

The matrix may further comprise means for tuning lasing wavelengths of individual lasers, in such a manner that a tuning range of each laser in the matrix is outside of stopbands of all other lasers which are physically closer to an output port of the matrix.

The arrangement of DFB lasers described above has the following advantages. A combination of a series of lasers into the matrix enables increase in the overall number of laser wavelengths and the number of wavelengths which can be simultaneously generated. The wafer space is used more efficiently, and the whole system becomes more compact relative to a single laser approach. Usage of redundant optical components for different wavelength channels is avoided which provides lower losses and more compact packaging of the system. Additionally, the laser structure provides a further enhanced tunable wavelength range which can be made continuous by an appropriate choice of Bragg wavelengths of the lasers. Furthermore, by using the interleaving arrangement for laser wavelengths, the interaction between lasers within the series is reduced. The interleaving arrangement of wavelengths reduces tight requirements on stopband widths and etch depth control for the series of strongly complex coupled DFB lasers. The laser structure can be wavelength locked either inside the module or outside of the package by use of a standard available wavelength locking scheme.

Thus, a matrix of DFB semiconductor lasers, insensitive to the external feedback and random facet phase variations, and capable of multi-wavelength generation and extended wavelength tuning range is provided.

BRIEF DESCRIPTION OF THE DRAWINGS

The invention will now be described in greater detail regarding the attached drawings in which.

DESCRIPTION OF PREFERRED EMBODIMENTS

Structure and Operation

Figure 1:
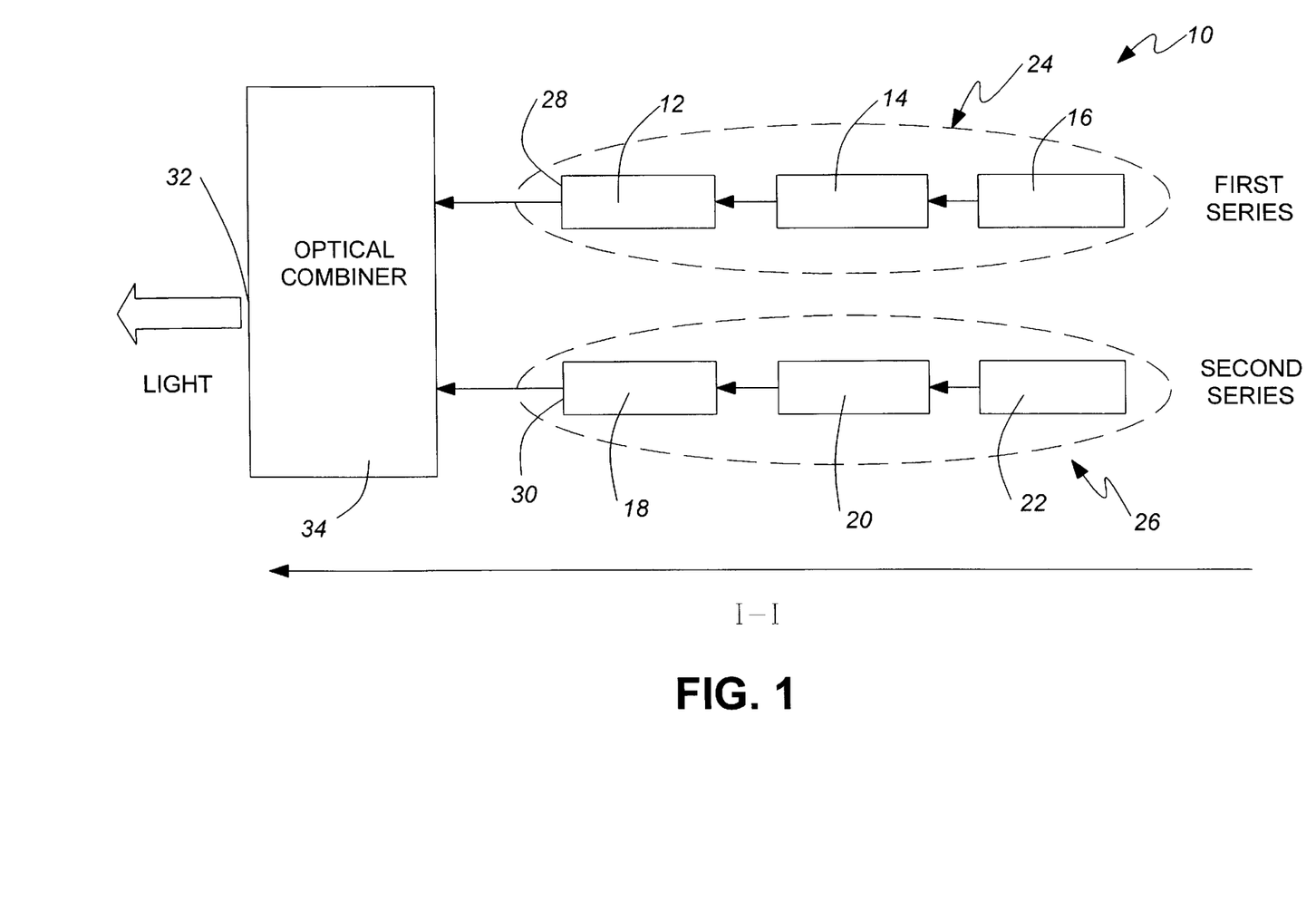
FIG. 1 is a schematic view of a matrix of DFB lasers according to a first embodiment of the invention.

A schematic view of a laser structure 10 forming a matrix of distributed feedback complex coupled semiconductor lasers according to a first embodiment of the present invention is shown in FIG. 1. The structure 10 includes six gain coupled DFB lasers 12, 14, 16, 18, 20, 22 which form two cascaded series of lasers. The first series 24 includes lasers 12, 14 and 16, and the second series 26 includes lasers 18, 20, and 22, the lasers in the series having their cavities arranged coaxially. Two series of lasers 24 and 26 have corresponding output facets 28 and 30 which are combined into a single waveguide output 32 using an on-chip integrated combiner 34. Two series of lasers generate light independently from each other and provide output of generated light along parallel optical axes and in the same direction as designated by numeral I—I in FIG. 1. The matrix 10 provides a tunable selective single wavelength operation or multiwavelength operation as will be described below.

Figure 2:
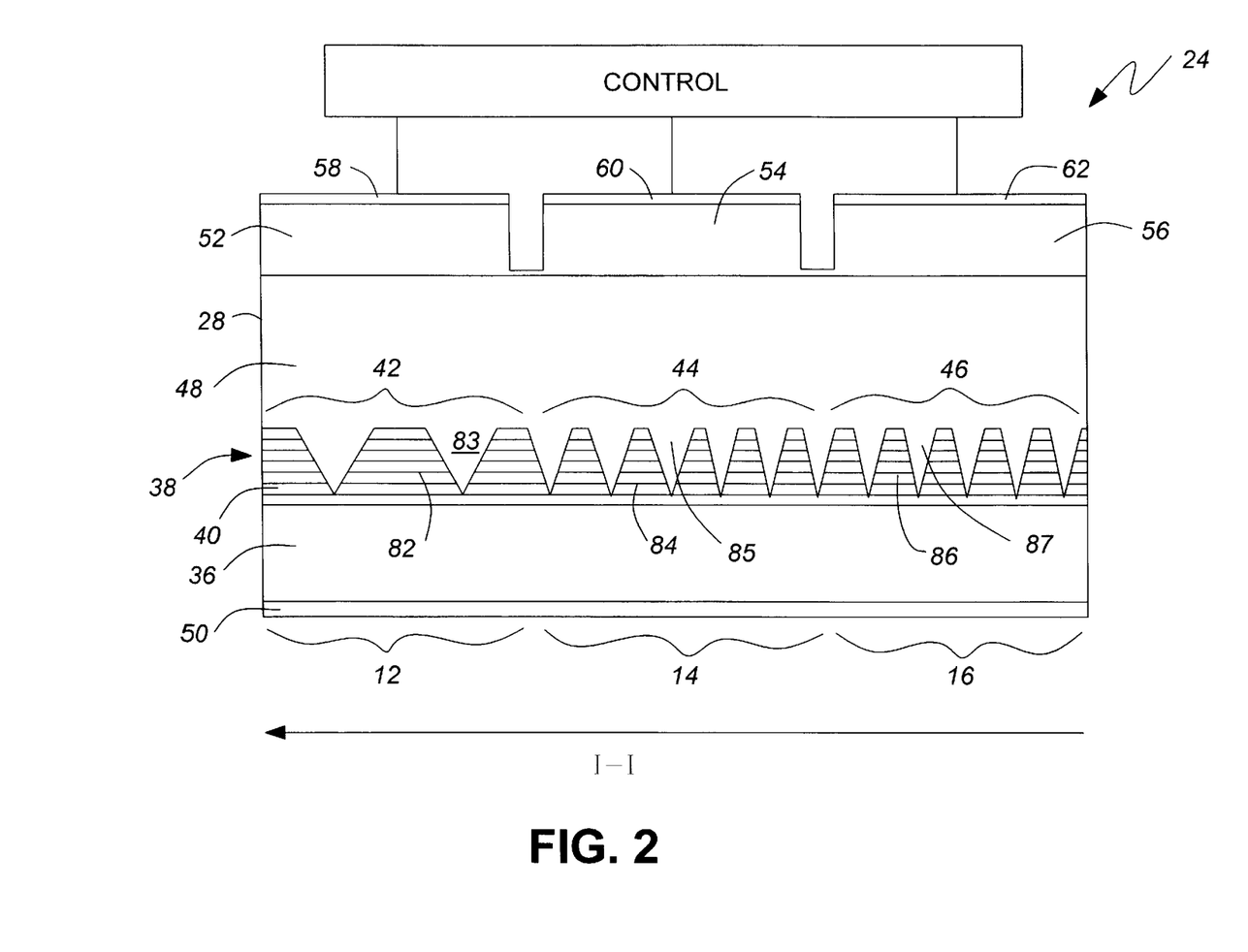
FIG. 2 is a schematic cross-sectional view of a first series of lasers of the matrix of FIG. 1.

A schematic cross section through the first series 24 of three DFB lasers is shown in FIG. 2. It is formed on a substrate 36 providing a first confinement region, an active region 38 comprising a multiple quantum well structure and a first, second and third gratings 42, 44, 46 defined therein, and an overlying confinement region 48. Excitation means for the series are formed thereon, and include a contact to the substrate 50, and a first, second and third current confining ridges 52, 54 and 56 defining first, second and a third lasers 12, 14 and 16 correspondingly, first, second and third contact electrodes 58, 60 and 62 being defined on each ridge respectively for current injection into the series structure. Three gratings 42, 44 and 46 positionally correspond to the first, second and third lasers of the series 12, 14 and 16 respectively. The gratings have different grating periods, defining corresponding Bragg wavelengths and laser stop bands. Periods of the gratings differ so as to provide a 6 nm center Bragg wavelength separation of adjacent gratings, the first grating 42 having the shortest Bragg wavelength and the grating 46 having the longest Bragg wavelength. It is arranged that each laser generates at the same side of its stop band, namely at a right Bragg mode, and the Bragg modes of the lasers are arranged in such a way that a lasing wavelength of each laser (including intended current and temperature tuning) is outside the stop bands of all other lasers which are closer to the output facet 28 of the series 24, thus ensuring that light generated by the more distant laser 16 will pass through lasers 14 and 12 which are closer to the series output facet 28. Gratings 42, 44 and 46 are made by periodic etching grooves through the active region 38, the etch depth being defined so as to provide a substantial insensitivity of each laser to the external feedback and random facet variations thereby ensuring no substantial interaction between lasers in the series as will be described in detail below. The lasers are equally spaced apart from each other, the separation being about 3 micrometers.

Figure 3:
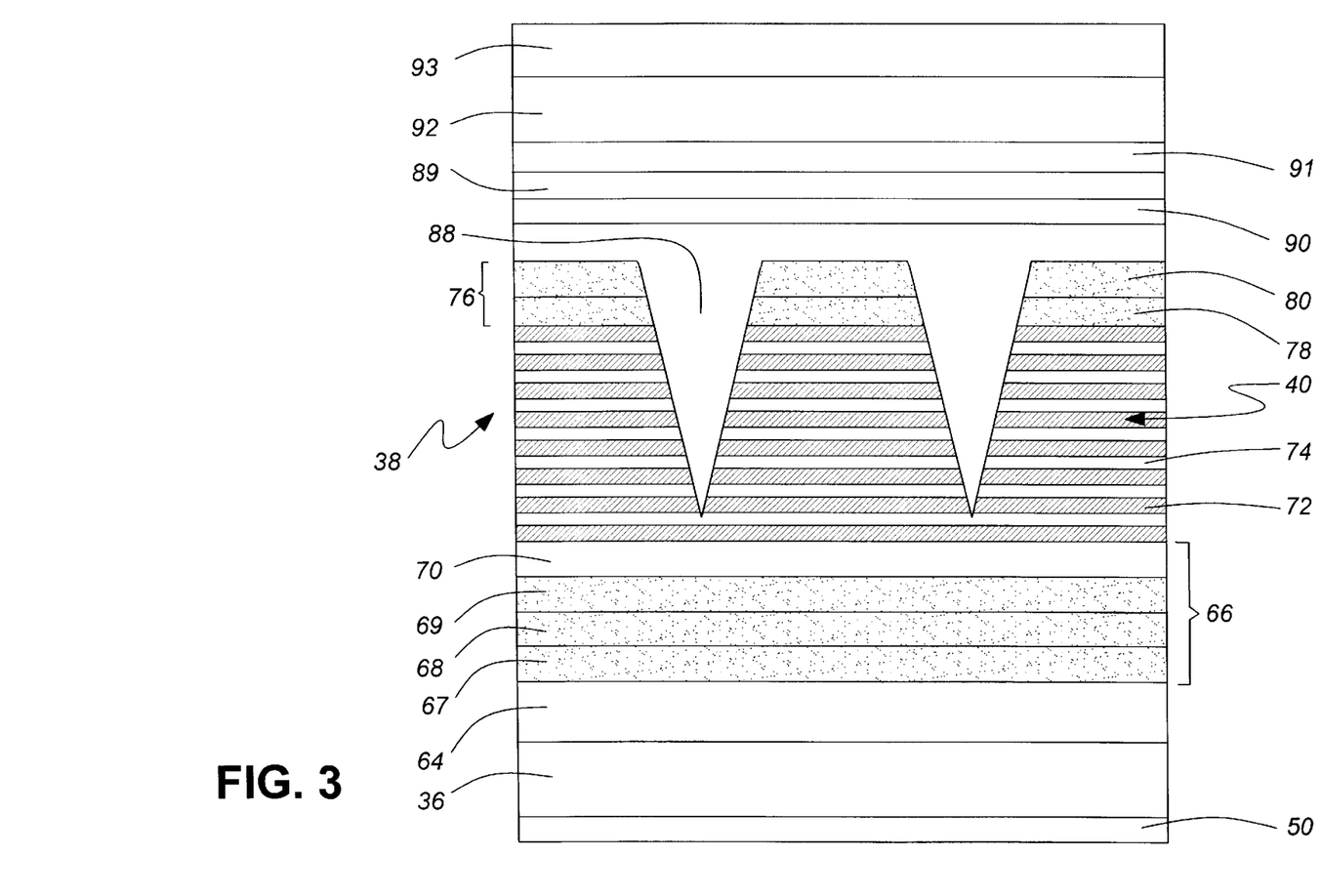
FIG. 3 is a detailed cross-sectional view of the series of lasers of FIG. 2.

The structure of the series 24 is shown in more detail in FIG. 3, which shows an oblique cross sectional view through the series 24. The DFB semiconductor laser series 24 is fabricated from Group III-V semiconductor materials, and comprises a heavily N-doped InP substrate 36, on which an N-doped InP buffer layer 64 of 1.5 $\mu$m thickness is defined. The first separate confinement region 66, consisting of four confinement layers 67, 68, 69 and 70 of N-doped InGaAsP with energy band gaps corresponding to wavelengths of 1.0

μm, 1.1 μm, 1.15 μm and 1.20 μm respectively, is provided over the buffer layer 64. The thickness of each confinement layer is 20 nm, and the confinement layer 67 corresponding to the 1.0 μm wavelength is adjacent to the buffer layer 64. The active region 38 overlies the confinement region 66 and comprises a multiple quantum well (MQW) structure 40 which includes four to eight 1% compressively strained N-doped, or undoped InGaAsP quantum wells 72, each being 5 nm thick, separated by several N-doped or undoped InGaAsP unstrained barriers 74 with a band gap corresponding to a wavelength of 1.20 μm, each barrier being 10 nm thick. The alloy composition and layer thickness of the MQW structure 40 are tailored to have specific band gap energies to provide for lasing at a required wavelength. Increasing the number of quantum wells provides higher gain per unit length of the laser cavity. The band gap of the quantum well structure described above provides a lasing wavelength of the device at about 1.55 μm. A second separate confinement region 76, consisting of two P-doped InGaAsP confinement layers 78 and 80, having energy band gaps corresponding to 1.1 μm and 1.20 μm wavelengths respectively, is grown on top of the MQW active region 40, each layer being 20 nm thick.

As mentioned above, gratings 42, 44 and 46 are defined by periodically etched grooves through the active region 40. The pitch of the groove of each grating is selected so as to define a first order grating for the lasing Bragg wavelength. Grating 42 has a period comprising a first section 82 and a second section 83 as shown in FIG. 1. Gratings 44 and 46 have corresponding first sections 84, 86 and second sections 85, 87. Second sections 83, 85 and 87 in the respective gratings 42, 44 and 46 are V-shaped and characterized by substantial etching away almost all quantum wells, namely, seven out of eight quantum wells in this embodiment. The more quantum wells are etched away from the section the less is the photon generation in the section. Thus, a deep etching through the second sections 83, 85 and 87 provides no substantial photon emission in these sections. Usually deep etching is avoided for a single laser because of the accompanied strong index coupling. For the series of DFB lasers, deep etching provides substantially independent generation of each laser in the series and no substantial interaction between lasers as will be described below.

A P-doped InP layer 88, having a band gap wavelength smaller than the quantum well band gap wavelength, fills the grooves of the gratings. A 3 nm thick etch stop layer 89 of P-doped InGaAsP, surrounded by P-doped InP buffer layer 90 at the bottom and P-doped InP buffer layer 91 at the top is formed next, the buffer layers being correspondingly 100 nm and 200 nm thick. An upper cladding layer 92 of P-type InP, followed by a highly doped P-type capping layer 93 of InGaAs for contact enhancement, having corresponding thicknesses 1600 nm and 200 nm complete the structure. The separation between the adjacent electrodes 58, 60 and 62 is in the range of 5 to 15 μm to ensure both a sufficient electrical isolation between the adjacent electrodes and a limited material absorption loss. Corresponding means (not shown) for simultaneous multi-wavelength generation of the series of lasers, means for controllably varying current injection and changing temperature of each laser for switching between lasing modes, preferably within a time interval from several nanoseconds to several miniseconds, and tuning of laser wavelength of each laser around a corresponding lasing mode are provided. The structure of the second series of lasers 26 is similar to that of the first series 24 as described above.

Figure 4:
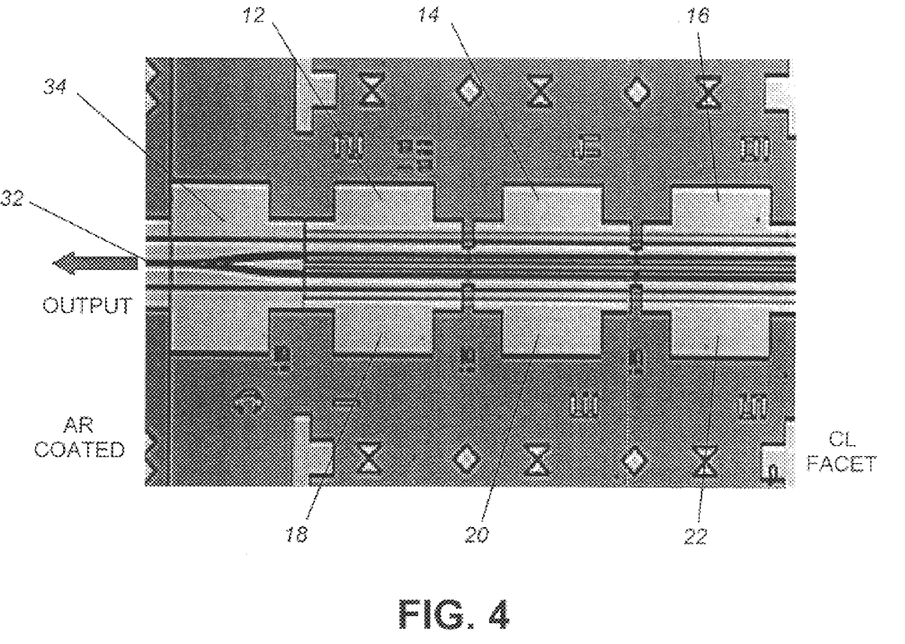
FIG. 4 is a top view electron photograph of the laser structure according to the first embodiment of the invention.

A top view electronic photograph of the laser structure 10 is shown in FIG. 4. Two parallel active ridge waveguides are placed in close proximity of about 25 μm to each other (which was varied from 10 μm to 250 μm in other experiments) and then combined into one output waveguide by a Y-junction combiner. Along each branch of the parallel waveguides, three sections of waveguides with independent current injection pads are formed. A uniform grating with a shifted Bragg wavelength are written by e-beam lithography under each waveguide section. All grating sections are etched simultaneously into active QW region to form a strong gain-coupling (SGC). As a result, a matrix of gratings having two cascaded series of three gratings each placed in close proximity is formed. The combiner 34 shares the active structure with all of the six gratings. Because there is no grating written under the combiner 34 it can serve as a semiconductor optical amplifier (SOA) when biased above transparency levels and/or as a power equalizer for different wavelength channels.

Thus, a matrix 10 of strongly gain coupled DFB semiconductor lasers is provided.

While the matrix described above is fabricated on a N-type substrate wafer, alternatively, a complimentary structure may be fabricated on a P-type wafer.

The substrate 36 on which the matrix 10 described above is fabricated is made of InP material which results in generating a laser light within a range of 1.3–1.56 μm, corresponding to a transparency window of this material. In modifications of this embodiment, the substrate may be made of GaAs material, having a window of transparency in a shorter wavelength range of 0.8–0.9 μm, which results in generating light in this wavelength range. More precise calculation of a lasing wavelength depends also on the properties of the active region and the gratings. In the laser cavity direction, for lasing to occur, the grating period is determined by an integer multiple of $\lambda/2n$ where $\lambda$ is very close to the desired lasing wavelength, (typically within several nm), and n is the refractive index of the material, usually in a range of 3–4 for semiconductor materials.

In modifications of this embodiment, the matrix 10 may comprise a first 12, second 14 and third 16 strongly loss coupled DFB lasers, each laser comprising a loss coupling grating 42, 44 and 46 correspondingly. The gratings will then have periods, defining corresponding laser stop bands and a center Bragg wavelength separation, the first grating 42 having the longest Bragg wavelength and the third grating having the shortest Bragg wavelength. It is also arranged that each laser generates at the left Bragg mode around its stop band, and a lasing wavelength of each laser in the series is outside the stop bands of all other lasers which are closer to the output facet 28 of the series 24.

In the embodiment described above, the laser structure has two series of lasers, each including three lasers. It is contemplated that in other embodiments of the invention the matrix may comprise a pre-determined number of series, and a pre-determined number of lasers in each series. Matrices of lasers including 8 lasers (two series, four lasers each) and 12 lasers (three series, four lasers each) have been implemented by using the technique above. An overall continuous tuning range of about 60 nm has been provided.

In another modification of the present embodiment, gratings associated with particular lasers in a matrix may be either uniform or chirped gratings, and periods of the gratings may vary to provide a predetermined center Bragg wavelength separation (usually within a range of several nanometers to several tens of nanometers) to ensure continuous laser tuning within a certain wavelength range. A height and a shape of the first and second sections of gratings periods may also vary to define photon emission in the sections, which, for example, have rectangular or trapezoidal shape. The matrix described includes an internal on-chip waveguide optical combiner. Alternatively, other known types of internal optical combiners, e.g. a multi-mode interference combiner, or an external optical combiner may be used to direct generated light into a common output. The combiner may be either passive or active, i.e. providing an amplification of light.

Principles of operation, demonstrated on a matrix of DFB lasers 10 of the first embodiment of the invention, are as follows.

It is known that complex coupled lasers provide an additional advantage over index coupled and quarter-wavelength shifted DFB lasers in suppressing one of the two originally degenerated Bragg modes. Both theory and experiment have confirmed that an in-phase gain coupled DFB laser will predominantly lase on a longer wavelength side of the stop band (right Bragg mode), while the anti-phase loss coupled DFB laser will predominantly lase on a shorter wavelength side of the stop band (left Bragg mode) to be further described.

For a gain coupled laser 12 with a grating 42 formed by direct etching through the active region, the second section of the grating period 83 where a portion of quantum wells is etched away, has smaller effective refractive index than the first section of the grating period 82 where the quantum wells are not etched at all. From a standing wave point of view, the first section 82 having higher refractive index, will support a photon emission at the longer wavelength, while the second section 83 having smaller refractive index, will support a photon emission at the shorter wavelength. Since there are more quantum wells in the first section 82 with a higher refractive index section, the emission at the longer wavelength will dominate. Nevertheless, if only a small portion of the quantum wells is etched away from the second section 83 of the grating period, a noticeable photon emission will still be generated in this section. In this instance, it is possible that laser 12 will generate at the short wavelength (left Bragg mode) as a dominant mode on certain occasions, when a combination of external facet phases or external feedback phases is in favor to the short wavelength, the situation being typical for index coupled lasers. In order to eliminate such an unpredictable combination of phases, in the laser of the embodiment substantially all quantum wells from the second section 83 of the grating period are removed, to ensure that no substantial emission is originally generated in this section. This will result in the photon emission in the first section 82 predominantly, and hence in lasing at the longer wavelength side of the stop band (right Bragg mode) only. The lasing mode of such a laser is therefore determined by an internal built-in and distributed mode selection means, for example, by the grating defined by deep etching rather than by the external facet phase and coating asymmetry. When arranged in a series, each of such lasers, being phase insensitive and providing stable single mode operation under almost all phase combinations, ensures almost independent operation of each laser and no substantial interaction between adjacent lasers in series. We have called such a laser a "strongly gain coupled DFB laser" and utilized it as a building block for series of DFB lasers which form the matrix 10.

To provide a path to the output facets 28 for light generated by all lasers in the series, it is necessary to satisfy certain requirements on laser wavelengths and pumping conditions. It is known that when an active region is pumped just above a transparency level (and below a threshold level), a DFB laser becomes transparent for a light passing through if a wavelength of the passing light is outside of the stop band. The same laser becomes lossy and not transparent for the light passing through if the wavelength of the passing light is within the stop band, regardless of the fact that the laser is pumped above the transparency level. Moreover, when the wavelength of the passing light is far enough from the stop band of the laser, it passes through the laser without substantial interaction even if the laser is pumped above a threshold level and generates a stable lasing mode by itself. Thus, for a particular laser in the series, it is necessary to generate light outside of the stop bands of all lasers which are closer to the output facet of the series to provide a path for light generated by each laser to the output facet. It may be conveniently arranged if each laser generates at the same side of its stop band, and Bragg wavelengths of lasers differ so as to provide a continuous tuning of the series as a whole. Alternatively, it may be arranged that each laser in the matrix generates at the wavelength which is outside of stopbands of all other lasers which are physically closer to an output port of the matrix. The tuning of lasing wavelengths of individual lasers may be provided in such a manner that a tuning range of each laser in the matrix is also outside of stopbands of all other lasers which are physically closer to an output port of the matrix. The principles described above are applicable to all series of lasers forming the laser structure 10 for both single wavelength tunable operation and the simultaneous multi-wavelength operation.

Figure 5:
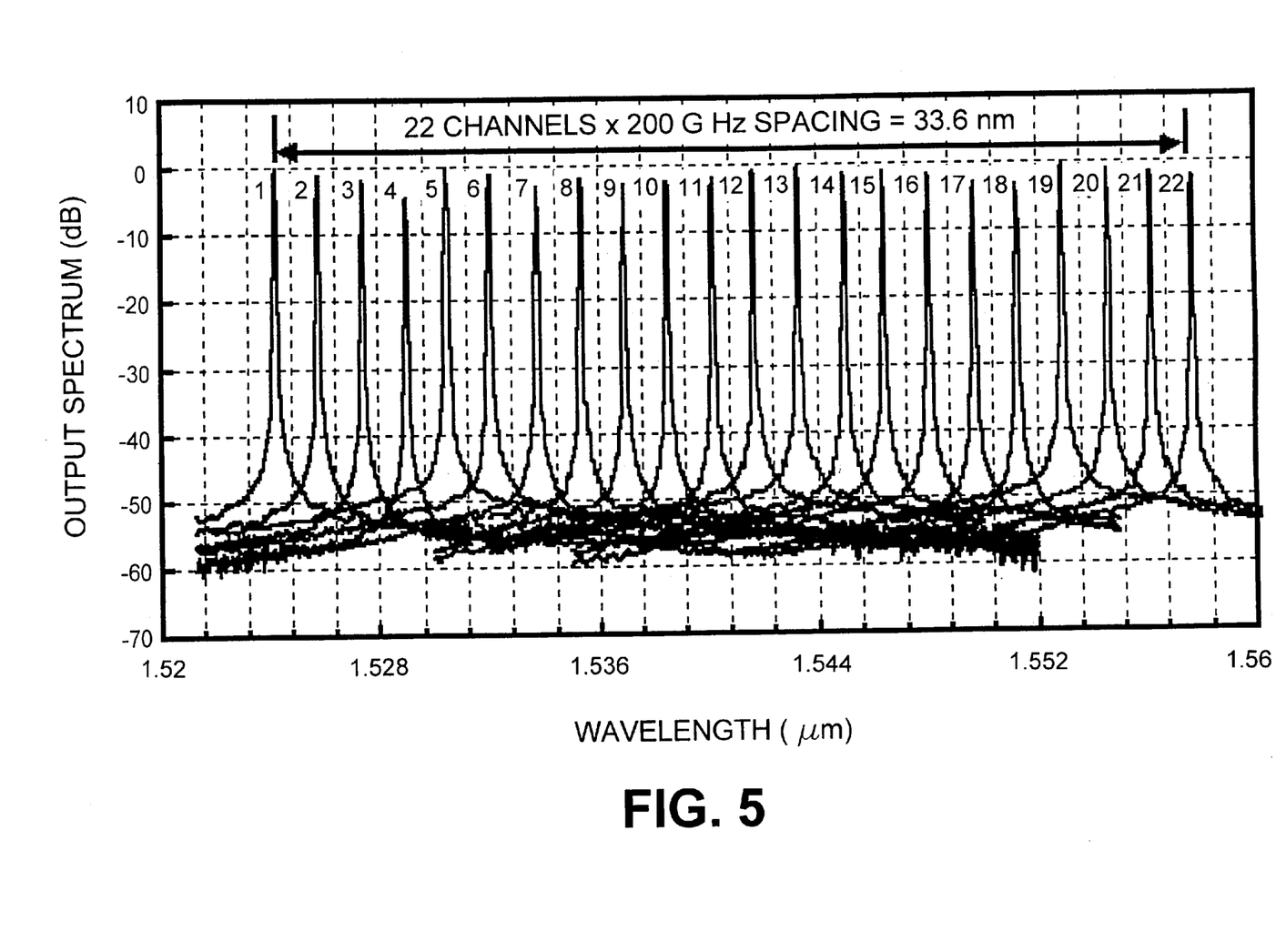
FIG. 5 is a combined wavelength tuning spectrum for the laser structure according to the first embodiment of the invention.

FIG. 5 illustrates a continuous wavelength tuning range for the matrix 10 of the first embodiment achieved by the current injection only. Due to the strong gain coupling, the single mode property for each laser is well maintained over the entire temperature and current range.

For each series having three lasers, there are three steps to obtain a corresponding tuning curve. They are illustrated on the first series 24 and are as follows:

i) The first laser 12 is biased from 60 mA to about 180 mA to obtain a continuous current induced wavelength tuning around 6 nm, while the other two lasers 14 and 16 are not biased at all. The injection current is adjusted so as to have lasing wavelengths (laser channels) separated by 1.5 nm. The first lasing spectrum including channels numbered from 1 to 4 in the FIG. 5 correspond to the first tuning step.

ii) The first laser 12 is biased at about 14 mA, which is slightly below the threshold and above the transparency level, in order to provide a transparent path for a lasing emission generated by the second laser 16 to pass through the first laser 12 without substantial losses. Then the laser 16 is biased from about 60 mA to about 180 mA to obtain another 6 nm current induced wavelength tuning range. The Bragg wavelength of the second laser 16 is arranged to be 6 nm longer than the Bragg wavelength of the first laser 12, so that tuning ranges of the first and second lasers just adjoin each other and provide a combined continuous tuning range of about 12 nm. Channels (7 to 11) in FIG. 5 illustrate a lasing spectrum achieved by tuning the second laser 14 only, while the third laser 16 is not biased at all and the first laser 12 is biased above the transparency level.

iii) The Bragg wavelength of the third laser 16 is arranged to be 12 nm longer than the Bragg wavelength of the first laser 12 and 6 nm longer than the Bragg wavelength of the second laser 14. When the first and second lasers 12 and 14 are biased above the transparency level as described above, the bias current of the third laser 16 is varied from about 60 mA to about 220 mA to obtain another continuous wavelength tuning range of the order of 8 nm. Channels (9 to 11 in FIG. 5) indicate three channels, each separated by 1.5 nm, achieved in the third tuning step. Thus, an overall continuous tuning range of about 17 nm is achieved for the first series 24 of the matrix 10 of DFB lasers.

Alternatively, a three step similar wavelength tuning may be achieved by varying the temperature.

The second series of lasers 26 provides three step wavelength tuning similar to that of the first series 24 and covers the remaining channels from 12 to 22. Thus, an overall tuning range of about 34 nm for the matrix 10 of lasers is achieved.

The laser structure is also capable of simultaneous multi-wavelength generation, where the number of generated wavelength is equal to the number of lasers in the series excited above threshold levels. For example, for the matrix of six lasers, it is possible to achieve one to six wavelength generation, depending on the number of lasers simultaneously pumped above threshold. Each of the generated wavelengths may be chosen from the tuning range of the corresponding laser, and the multi-wavelength generation is emitted through the single common output port.

Figure 6:
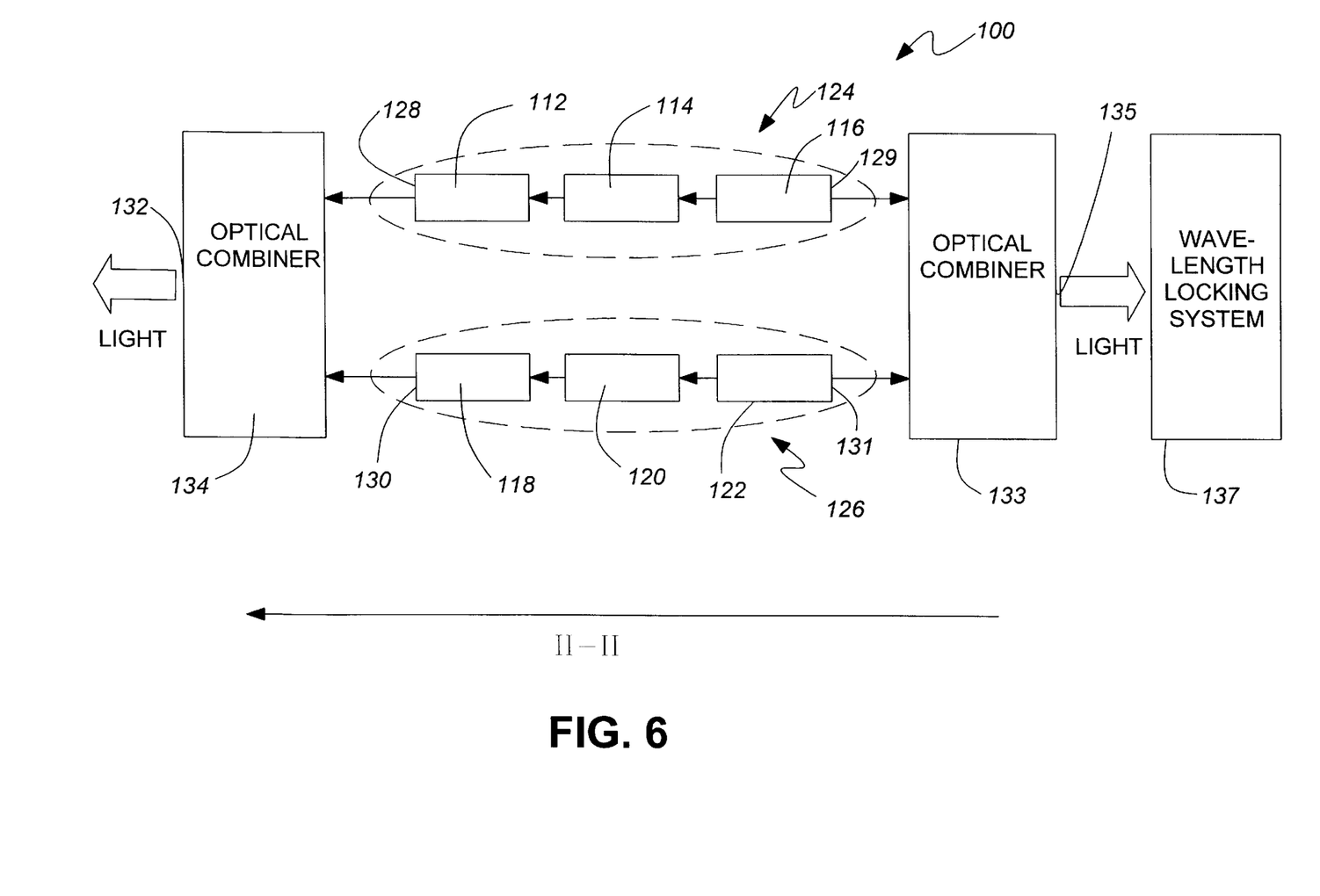
FIG. 6 is a schematic view of a matrix of DFB lasers according to a second embodiment of the invention.
Figure 7A:
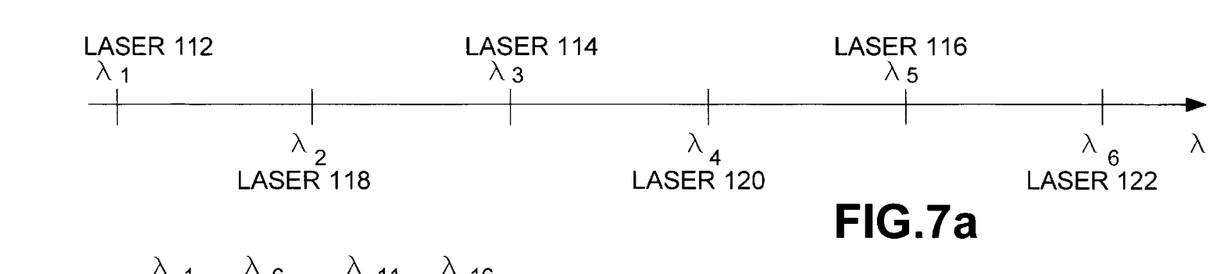
FIG. 7a is an illustration of an interleaving arrangement of Bragg wavelengths.

The matrix of semiconductor lasers 100 of a second embodiment is shown in FIG. 6. It is similar to that of the first embodiment except for using a second optical combiner 133 and wavelength locking system 137 and providing an interleaving of laser Bragg wavelengths as will be described below. To facilitate comparison with FIG. 1, corresponding parts of the matrix are denoted by the same reference numerals, incremented by 100. The matrix 100 includes six gain coupled DFB lasers 112, 114, 116, 118, 120, 122 which form two cascaded series of lasers. The first series 124 includes lasers 112, 114 and 116, and the second series 126 includes lasers 118, 120, and 122, the lasers in the series having their cavities arranged coaxially. Each of the series have two output facets, namely the series 124 has a front facet 128 and a rear facet 129, and the series 126 has a front facet 130 and rear facet 131. Front output facets 128 and 130 are combined into a single waveguide output 132 using an on-chip integrated combiner 134. Similarly the rear facets 129 and 131 are combined into a single waveguide output 135 using an optical combiner 133 followed by a wavelength locking system 137. The locking system provides monitoring and stabilization of laser wavelengths using known locking techniques, e.g. the one described in U.S. Pat. No. 5,825,792 to B. Villeneuve. Series of lasers generate light independently from each other and provide output of generated light along parallel optical axes and in parallel directions as designated by numeral II—II in FIG. 6. Bragg wavelengths of lasers forming the matrix 100 are arranged so that they interleave with each other as shown in FIG. 7a, namely lasers 112, 114 and 116 generate light at wavelengths $\lambda_1$, $\lambda_2$ and $\lambda_3$ wherein lasers 118, 120 and 122 generate light at wavelengths $\lambda_2$, $\lambda_4$ and $\lambda_6$ correspondingly. Separation between Bragg wavelengths is chosen so that light generated at each of wavelengths falls outside the stopbands of other lasers. Continuous tuning wavelength range of the matrix as a whole is ensured either by current or temperature tuning and provided by tuning individual lasers in the following sequence: laser 112, laser 118, laser 114, laser 120, laser 116 and laser 122. The rest of the structure of the matrix 100 is similar to that of the first embodiment described above.

Operation of laser structure 100 is as follows. For each series having three lasers, there are three steps to obtain a corresponding tuning curve. They are illustrated on the first series 124 and are as follows:

i) The first laser 112 is biased at 80 mA, and the based temperature of the chip is varied from 0° C. to 50° C. to obtain a continuous wavelength tuning of about 5 nm, while the other two lasers 114 and 116 are not biased at all. The temperature is adjusted so as to have lasing wavelengths (laser channels) separated by 1.6 nm. The first lasing spectrum including channels numbered from 1 to 4 is similar to that shown in FIG. 5 correspond to the first tuning step.

ii) The first laser 112 is biased at about 10 mA, which is slightly below the threshold and above the transparency level in order to provide a transparent path for a lasing emission generated by the second laser 116 to pass through the first laser 112 without substantial losses. Then the laser 116 is biased at about 80 mA and the base temperature is varied from 0° C. to 50° C. to obtain another 5 nm wavelength tuning range. The Bragg wavelength of the second laser 116 is arranged to be about 10~11 nm longer than the Bragg wavelength of the first laser 112, so that tuning ranges of the first and second lasers do not adjoin each other. The continuous tuning range is achieved by interleaving the two sub sets of semi-continuous tuning range provided by the two branches of series lasers located in close physical proximity to each other. The channels numbered 9 to 12 similar to ones shown in FIG. 5 cover a lasing spectrum achieved by tuning the second laser 114 only, while the third laser 116 is not biased at all and the first laser 12 is biased above the transparency level.

iii) The Bragg wavelength of the third laser 116 is arranged to be about 20~21 nm longer than the Bragg wavelength of the first laser 112 and about 10~11 nm longer than the Bragg wavelength of the second laser 114. When the first and second lasers 112 and 114 are biased above the transparency level as described above, the bias current of the third laser 116 is set at 100 mA while the base temperature is varied from 0° C. to 50° C. to obtain another continuous wavelength tuning range of the order of 5 nm. The channels 17 to 20 are similar to those shown in FIG. 5, each separated by 1.6 nm, are covered in the third tuning step. Alternatively, a three step similar wavelength tuning may be achieved by varying the current from 40 mA~200 mA at a fixed base temperature. The wavelength tuning by current is obtained by intentionally increasing the thermal impedance of the chip-on-carrier packaging, such that a large effective active temperature rise compared with the base temperature can be obtained by relatively smaller amount of current injection.

The second series of lasers 126 provides a three step wavelength tuning similar to that of the first series and covers the remaining channels 5 to 8, channels 13 to 16 and channels from 21 to 24. Thus, an overall tuning range of about 34 nm for the matrix 100 of lasers is achieved.

Figure 7B:
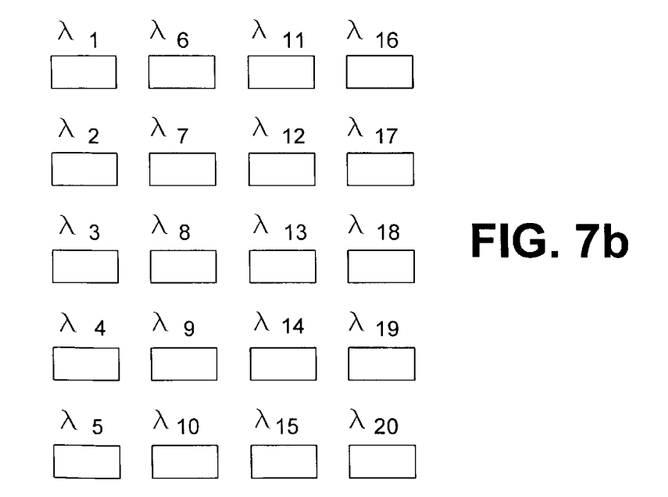
FIG. 7b is an illustration of the laser structure including 4 lasers in each of the five series.
Figure 7C:
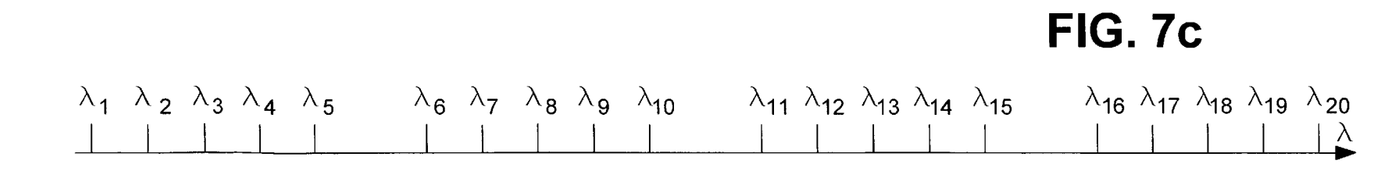
FIG. 7c is an illustration of one of the possible wavelength arrangements providing five fold multiplicity.

In the embodiments described above, the laser structure comprises a series of lasers having same number of gain coupled DFB lasers. It is also contemplated that a matrix of yet another embodiment may comprise a pre-determined number of DFB lasers in each series, each laser being a gain coupled or a loss coupled laser, wherein the number of series is varied. Preferably, the lasers have outputs in the same direction and from the same output facet of the series. Outputs from different series are combined via an optical combiner into a common output of the matrix. Alternatively, for the laser structure it is also possible to have two outputs in opposite directions. For example, in a laser structure, a pre-determined number of series may provide output of generated light in one direction, the rest of the series providing output of the generated light in the opposite direction. Correspondingly, two optical combiners, each at one output, are required. It is preferably arranged that each laser in the series generates at the right Bragg mode around its stop band for gain coupled lasers or at the left Bragg mode for loss coupled lasers, and the lasing wavelength of each laser which is closer to the output facet of the series, including current and temperature tuning, does not fall within the stop band of the adjacent laser which is further away from the output facet, thus ensuring that light generated by a more distant laser will pass through the system without substantial losses. Any other arrangement for Bragg wavelengths of the lasers, providing a transparent path to the output facet, is also acceptable. Preferably, a center Bragg wavelength separation of lasers in each series is chosen to provide a continuous wavelength tuning range for the series as a whole, and tuning ranges of different series are chosen so as to provide a continuous wavelength tuning range for the matrix as a whole. Alternatively, tuning ranges of different series may be not adjacent to each other. For example, Bragg wavelengths of lasers from different series may interleave with each other with a multiplicity of interleaving ranging up to the number of series in the matrix. For example, a matrix providing five way interleaving of laser wavelengths (five-fold multiplicity) may include five series of lasers, each series having a pre-determined number of lasers. The laser structure including 4 lasers in each of the five series is shown in FIG. 7b. One of the possible wavelength arrangements providing five fold multiplicity is shown in FIG. 7c correspondingly.

Figure 8:
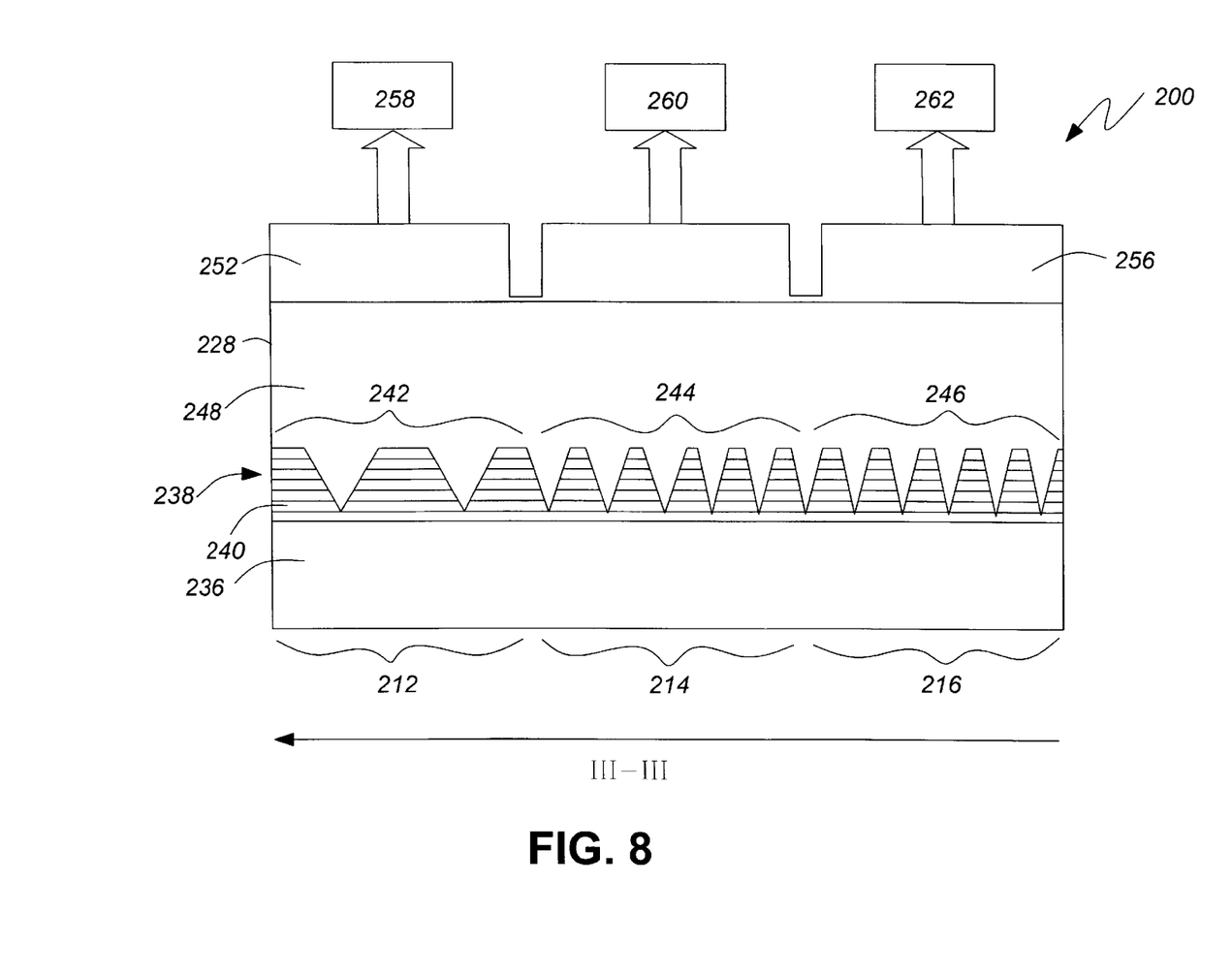
FIG. 8 is a schematic cross-sectional view of a series of DFB lasers forming a laser structure according to a third embodiment of the invention.

The matrix of semiconductor lasers of the embodiments described above comprises semiconductor diode lasers, i.e., lasers having contacts for electrical excitation of the active region by current injection. It is also contemplated that a matrix 200 of a second embodiment, shown in FIG. 8, is provided with optical pumping means 258, 260 and 262, replacing corresponding electrical contacts 58, 60 and 62 of the first embodiment, e.g., by providing population inversion with suitable optical coupling to another light source on the substrate. The matrix 200 according to this embodiment comprises a first excitation means 258, a second excitation means 260 and a third excitation means 262 for an independent pumping of the first 212, second 214 and third 216 lasers axially distinct along a cavity length direction designated by a numeral III—III in FIG. 8, and having a single common output 228 arranged along the line III—III and in the direction shown by an arrow on the line III—III. Means for varying the pumping of one laser with respect to the pumping of another, means for tuning a laser wavelength around the corresponding lasing mode and means for switching between lasing modes are also provided (none being shown). The rest of the structure of the matrix 200 is similar to that of the first embodiment described above. It comprises a substrate 236 providing a first separate confinement region, an active region 138 comprising a MQW structure 240 and a first, second and third gratings 242, 244 and 246 defined therein, and an overlying confinement region 248. First, second and third confining ridges 252, 254 and 256 define first, second and third lasers 212, 214 and 216 as described above.

It is also contemplated that a laser structure of alternative embodiments may comprise buried heterostructure lasers in contrast to the ridge waveguide lasers described in the above embodiments.

The matrix of strongly complex coupled DFB lasers described above has advantages over other similar structures which can be summarized as follows.

Each laser in the matrix provides an excellent SMSR over the entire tuning range due to the removal of left Bragg mode from generation. There is very little chance for one laser to switch from the right Bragg mode to the left Bragg mode due to the intrinsic structure of the laser itself.

There is no substantial interaction among lasers within one series due to the insensitivity of each laser to facet phase and facet reflection amplitude, and therefore to external effective feedback or optical injection from external source, such as the adjacent laser in the series. By doing so, it provides an excellent laser linewidth which is comparable with the stand alone DFB lasers normally used in the industry. A linewidth of the matrix DFB lasers as a whole at an achievable wavelength is in the range of MHz.

The matrix of strongly coupled lasers provides more simple manufacturing and effective use of wafer space. Due to insensitivity of lasers to facet phases and the interaction between lasers, control of manufacturing of the series is less stringent, and testing of such lasers is more straightforward.

The matrix of strongly coupled DFB lasers provides a high predictability and controllability of laser wavelength. Since each laser generates at a predetermined right Bragg mode, and there is very little chance for the mode to switch to the left Bragg mode, the entire tuning range is continuous for both current and temperature tuning, and the lasing wavelength can be simply predicted and controlled in the practical system applications.

The number of transmitted channels is significantly increased relative to a single laser approach and a series of lasers approach. Since the laser structure has one or two common outputs, it can be easily integrated with other optical devices, such as electro-absorption modulators, Mach-Zender modulators, detectors, tunable filters. It greatly simplifies module packaging and significantly reduces overall costs of the system implementation.

A matrix of DFB lasers as described above provides not only a possibility of achieving a wide and stable wavelength tuning range, but also a simultaneous multi-wavelength operation with several well defined laser peaks and excellent adjacent side mode suppression.

FABRICATION:

Fabrication of the laser structure of strongly gain coupled DFB semiconductor lasers 10 according to the first embodiment shown in FIG. 1 proceeds in four stages as follows:

1. first epitaxial growth of substrate and multiple quantum well structure;
2. patterning of the grating structure;
3. second epitaxial growth of the overlying layers;
4. completion of the laser fabricating (e.g. ridge formation, contacts).

The prepared substrate 36 is loaded promptly into a commercially available CVD growth chamber, and a buffer layer 64 of InP followed by the first confinement region 66, including four layers of InGaAsP, is grown. The active region 38, comprising eight 1% compressively strained P-doped InGaAsP quantum wells 72, separated by seven P-doped InGaAsP unstrained barriers 74, is grown next.

The wafer is then removed from the growth chamber and processed so as to form photolithographically six gratings by periodically etched grooves through the active region 38, namely the gratings 42, 44 and 46 and corresponding gratings for the second series of lasers 26. First, a dielectric such a $SiO_2$ (not shown) is grown on the surface of the wafer, and the groove pattern is created in the dielectric layer. The grooves are etched using the process of reactive ion etching or wet chemical etching. The residual dielectric is then removed. Using known crystal growth techniques, for example, a metal oxide chemical vapor deposition, an InP layer 88 is grown in the grooves. Etch stop layer 89 of InGaAsP grown between two buffer layers 90 and 91 of InP, followed by cladding layer 92 of InP and capping layer 93 of InGaAs complete the structure. Matrix fabricating is then completed using a standard process. For example, to form rectangular ridge waveguides 52, 54 and 56 for the first series 24 and corresponding waveguides for the second series 26 perpendicular to the grooves of the gratings, a ridge mask is provided on the substrate, and the ridges are formed by etching through the capping layer 93 and top cladding layer 92, the ridges being 2 $\mu$m nominal width. The split top electrodes 58, 60 and 62 for the first series 24 and corresponding electrodes for the second series 26 are defined by the mask used in the metalization step and created in the lift-off process. The output facets 28, 30 of each series are AR-coated (anti-reflection coated). Back facets may be AR-coated, as-cleaved or HR-coated (high-reflection coated). Alternatively, after the second regrowth, when a current confining region is formed on the active region, a buried heterostructure may also be grown. The optical combiner is formed at the same time as the ridge waveguide for lasers, except there is no grating under the combiner section.

Thus, it will be appreciated that, while specific embodiments of the invention are described in detail above, numerous variations, modifications and combinations of these embodiments fall within the scope of the invention as defined in the following claims.

What is claimed is:

1. A laser structure comprising a plurality of semiconductor laser series arranged in a cascade to form a matrix of lasers,
    each series having an output facet and including a plurality of complex coupled distributed feedback semiconductor lasers having laser cavities arranged coaxially along the same optical axis, each laser comprising:
    a) a substrate;
    b) an active region formed on the substrate and comprising a multiple quantum well structure;
    c) an excitation means for pumping the active region;
    d) a complex coupled grating having corrugations along the optical axis formed by periodic etching grooves through the active region, the grating having a period comprising a first section and a second section, wherein substantially all quantum wells are etched away from the second section providing no substantial photon emission in the second section and ensuring no substantial interaction between lasers in the series,
    a Bragg wavelength of each laser in the series being outside the stop bands of all other lasers which are closer to the output facet of the series.

2. A laser structure as defined in claim 1 further comprising an optical combiner to direct light generated by the plurality of series into a common output.

3. A laser structure as defined in claim 2 comprising two optical combiners providing two outputs of generated light in opposite directions.

4. A laser structure as defined in claim 2 wherein the optical combiner is one of the passive and active optical combiner.

5. A laser structure as defined in claim 4 wherein the optical combiner is an external optical combiner.

6. A laser structure as defined in claim 4 wherein the optical combiner is an internal optical combiner.

7. A laser structure as defined in claim 6 wherein the internal optical combiner is one of the on-chip single mode waveguide combiner and multi mode interference combiner.

8. A laser structure as defined in claim 1 wherein each series comprises a pre-determined number of lasers.

9. A laser structure as defined in claim 8 wherein the number of lasers in each series is the same.

10. A laser structure as defined in claim 1 wherein each series has only one output facet.

11. A laser structure as defined in claim 10 wherein all series of lasers provide output of generated light in the same direction.

12. A laser structure as defined in claim 10 wherein a pre-determined number of series provide a first output for generated light in one direction, the rest of the series providing a second output for the generated light in the opposite direction.

13. A laser structure as defined in claim 12 wherein further including a first optical combiner at the first output and a second optical combiner at the second output.

14. A laser structure as defined in claim 1 providing output of generated light in two opposite directions.

15. A laser structure as defined in claim 1 wherein each series operates in one of the single wavelength and multi-wavelength regime.

16. A laser structure as defined in claim 1 further comprising means for tuning a laser wavelength of each laser around a corresponding lasing mode.

17. A laser structure as defined in claim 1 wherein each series comprises one of the gain coupled lasers having gain coupled gratings and loss coupled lasers having loss coupled gratings.

18. A laser structure as defined in claim 17 wherein, for the series comprising gain coupled lasers, each laser generates at the right Bragg mode around its stop band, and the Bragg modes of lasers differ so as to provide a continuous tuning range for the series as a whole.

19. A laser structure as defined in claim 18 wherein tuning ranges of different series are chosen so as to provide a continuous wavelength tuning range for the matrix as a whole.

20. A laser structure as defined in claim 17 wherein, for the series comprising loss coupled lasers, each laser generates at the left Bragg mode around its stop band, and the Bragg modes of lasers differ so as to provide a continuous tuning range for the series as a whole.

21. A laser structure as defined in claim 20 wherein tuning ranges of different series are chosen so as to provide a continuous wavelength tuning range for the matrix as a whole.

22. A laser structure as defined in claim 1 wherein Bragg wavelengths of lasers from different series interleave with each other.

23. A laser structure as defined in claim 22 wherein a multiplicity of interleaving equals to the number of series in the matrix.

24. A laser structure as defined in claim 22, wherein a multiplicity of interleaving is less than the number of series in the matrix.

25. A laser structure as defined in claim 1 comprising an even number of series combined into pairs, Bragg wavelengths of lasers within the pair being in an interleaving arrangement.

26. A laser structure as defined in claim 1 capable of multi-wavelength generation, wherein the number of generated wavelengths is equal to a number of lasers in the matrix excited above threshold levels.

27. A laser structure as defined in claim 1 further comprising means for wavelength switching between lasing modes generated by lasers in the series.

28. A laser structure as defined in claim 27 wherein the means for wavelength switching provides switching within a time interval from about several nanoseconds to about several miniseconds.

29. A laser structure as defined in claim 1 wherein a height and a shape of the sections of the grating period define photon emission in the sections.

30. A laser structure as defined in claim 29 wherein the first and second sections have a rectangular or trapezoidal shape.

31. A laser structure as defined in claim 30 wherein the second section is V-shaped.

32. A laser structure as defined in claim 1 wherein the grating is a first order grating.

33. A laser structure as defined in claim 1 wherein the grating is a chirped grating.

34. A laser structure as defined in claim 1 wherein the means for pumping the active region comprises electrical contacts for current injection into the active region.

35. A laser structure as defined in claim 30 wherein a current confining region is formed on the active region.

36. A laser structure as defined in claim 35 wherein the current confining region is a ridge waveguide.

37. A laser structure as defined in claim 36 wherein the current confining region is a buried hetero-structure.

38. A laser structure as defined in claim 1 wherein the means for pumping the active region comprises an external optical pumping source.

39. A laser structure as defined in claim 1 the matrix being integrated within a package.

40. A laser structure as defined in claim 39 the package further including an internal optical combiner.

41. A laser structure as defined in claim 1 where a lateral distance between cascaded series is from about 10 $\mu$m to about 250 $\mu$m.

42. A laser structure as defined in claim 1 the structure being formed monolithically on a chip.

43. A laser structure comprising a plurality of semiconductor laser series arranged in a cascade to form a matrix of lasers, each series including a plurality of complex coupled distributed feedback semiconductor lasers having laser cavities arranged coaxially along the same optical axis, each laser comprising:
a) a substrate;
b) an active region formed on the substrate and comprising a multiple quantum well structure;
c) an excitation means for pumping the active region;
d) a complex coupled grating having corrugations along the optical axis formed by periodic etching grooves through the active region, the grating having a period comprising a first section and a second section, wherein substantially all quantum wells are etched away from the second section providing no substantial photon emission in the second section and ensuring no substantial interaction between lasers in the series;
a Bragg wavelength of each laser in the matrix being outside of stopbands of all other lasers which are physically closer to an output port of the matrix.

44. A laser structure as defined in claim 43 wherein a wavelength tuning range of each laser in the matrix is outside of stopbands of all other lasers which are physically closer to an output port of the matrix.

45. A laser structure as defined in claim 43, the structure being formed monolithically on a chip.

* * * * *